(12) United States Patent
Joe

(10) Patent No.: US 7,129,187 B2
(45) Date of Patent: Oct. 31, 2006

(54) LOW-TEMPERATURE PLASMA-ENHANCED CHEMICAL VAPOR DEPOSITION OF SILICON-NITROGEN-CONTAINING FILMS

(75) Inventor: Raymond Joe, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/891,301

(22) Filed: Jul. 14, 2004

(65) Prior Publication Data

US 2006/0014399 A1   Jan. 19, 2006

(51) Int. Cl.
   *H01L 21/31*   (2006.01)
(52) U.S. Cl. .................. 438/769; 438/771; 438/772; 438/774; 438/775; 438/776; 438/777; 438/778; 438/779; 438/780; 438/786; 438/791; 438/792; 438/793; 438/794
(58) Field of Classification Search ............... 438/769, 438/771–772, 774–780, 786, 791–794
   See application file for complete search history.

(56) References Cited

U.S. PATENT DOCUMENTS

| | | | | |
|---|---|---|---|---|
| 4,863,755 | A | 9/1989 | Hess et al. | 427/39 |
| 6,790,788 | B1 * | 9/2004 | Li et al. | 438/778 |
| 6,890,869 | B1 * | 5/2005 | Chung | 438/794 |
| 2003/0162412 | A1 | 8/2003 | Chung | 438/791 |
| 2004/0253777 | A1 | 12/2004 | Miyoshi et al. | |

FOREIGN PATENT DOCUMENTS

| | | |
|---|---|---|
| EP | 1638139 A1 | 11/2004 |
| WO | WO9418355 A1 | 8/1994 |
| WO | WO9515571 A1 | 6/1995 |
| WO | WO9527292 A1 | 10/1995 |
| WO | WO9527293 A1 | 5/2006 |

OTHER PUBLICATIONS

Gerstenberg et al., *Gas Evolution Studies for Structural Characterization of Hexamethyldisilazane-based α-Si:C:N:H Films*, J. Appl. Phys. 62(5), Sep. 1, 1987, pp. 1782-1787.

J. Tyczkowski et al., *Low Temperature Conductivity in Plasma Deposited Amorphous Dielectric Films*, IEEE, 1992, pp. 77-81.

M. T. Kim et al., *Characterization of Amorphous SiC:H Films Deposited from Hexamethyldisilazane*, Thin Solid Films 303, 1997, pp. 173-179.

R. González-Luna et al., *Deposition of Silicon Oxinitride Films from Hexamethyldisilazane (HMDS) by PECVD*, Thin Solid Films 317, 1998, pp. 347-350.

Min Tae Kim, *Deposition Kinetics of Silicon Dioxide from Hexamethyldisilazane and Oxygen by PECVD*Thin Solid Films 347, 1999, pp. 99-105.

(Continued)

*Primary Examiner*—Lynne A. Gurley
(74) *Attorney, Agent, or Firm*—Wood, Herron & Evans, LLP

(57) ABSTRACT

A method for low-temperature plasma-enhanced chemical vapor deposition of a silicon-nitrogen-containing film on a substrate. The method includes providing a substrate in a process chamber, exciting a reactant gas in a remote plasma source, thereafter mixing the excited reactant gas with a silazane precursor gas, and depositing a silicon-nitrogen-containing film on the substrate from the excited gas mixture in a chemical vapor deposition process. In one embodiment of the invention, the reactant gas can contain a nitrogen-containing gas to deposit a SiCNH film. In another embodiment of the invention, the reactant gas can contain an oxygen-containing gas to deposit a SiCNOH film.

56 Claims, 3 Drawing Sheets

OTHER PUBLICATIONS

Dong-Hau Kuo et al., *Thick SiO, Films Obtained by Plasma-Enhanced Chemical Vapor Deposition Using Hexamethyldisilazane, Carbon Dioxide and Hydrogen*, J. Electrochem. Soc. 147(7), 2000, pp. 2679-2684.

Taguchi et al., *Reduction of Carbon Impurity in Silicon Nitride Films Deposited from Metalorganic Source*, Jap. Journal of Appl. Physics, 43(2A), 2004, pp. L148-L150.

Fainer et al., Synthesis of nanocrystalline silicon carbontride films by remote plasma enhanced chemical vapor deposition using the mixture of hexamethyldisilazane with helium and ammonia; Journal fo Crystal Growth 248, 2003, pp. 175-179.

Smirnova et al., The mechanism of dehydrogenation of SiNx:H films; Thin Solid Films 293, 1997, pp. 6-10.

Bielinski et al., Mechanical and tribological properties of thin remote microwave plasma CVD a-Si:N:C films from a single-source precursor; Tribology Letters, vol. 13, No. 2, Aug. 2002, pp. 71-76.

Fainer et al., The investigation of properties of silicon nitride films obtained by RPECVD from hexamethyldisilazane; Applied Surface Science 113/114, 1997, pp. 614-617.

European Patent Office, Search Report included with Invitation to PAy Additional Fees, Feb. 28, 2006, 7 pgs.

* cited by examiner

LOW-TEMPERATURE PLASMA-ENHANCED CHEMICAL VAPOR DEPOSITION OF SILICON-NITROGEN-CONTAINING FILMS

FIELD OF THE INVENTION

The present invention relates to substrate processing, and more particularly, to a method for low-temperature plasma-enhanced chemical vapor deposition of a silicon-nitrogen-containing film on a substrate.

BACKGROUND OF THE INVENTION

Silicon-containing films are used for a wide variety of applications in the semiconductor industry. Silicon-containing films include silicon films such as polycrystalline silicon (poly-Si) and epitaxial silicon, silicon germanium (SiGe), silicon germanium carbide (SiGeC), silicon carbide (SiC), silicon nitride (SiN), silicon carbonitride (SiCN), and silicon carboxide (SiCO). Various physical and/or chemical deposition techniques are routinely employed for silicon-containing film deposition, and often more than one technique may be used to deposit a particular film. The preferred deposition method is determined by considering the desired film properties, physical and/or chemical constraints imposed by the device being fabricated, and economic factors associated with the manufacturing process. The selected process is often the one that provides an acceptable trade-off to address the pertinent technical and economic concerns.

Thermally excited chemical vapor deposition (CVD) is a common technique used to deposit materials for integrated circuit fabrication. In a typical embodiment, a substrate (wafer) is placed in a low-pressure process chamber and maintained at a controlled temperature. The substrate is exposed to gaseous ambient of one or more precursors that contain the chemical elements to be incorporated in the film. The gaseous precursors are transported to the substrate surface and combine via one or more chemical reactions to form a solid film. The conditions of the reactor chamber, substrate, and precursor are typically chosen to favor chemical reactions that produce films with the desired physical, chemical, and electrical properties.

A plasma can be employed to alter or enhance the film deposition mechanism. A deposition process that employs a plasma is generally referred to as a plasma-enhanced chemical vapor deposition (PECVD). In general, a plasma is formed in a vacuum reactor by exposing a gas mixture to a RF signal and exciting electrons to energies sufficient to sustain ionizing collisions with a supplied process gas. Moreover, the excited electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber.

Plasma excitation generally allows film-forming reactions to proceed at temperatures that are significantly lower than those typically required to produce a similar film by thermally excited CVD. In addition, plasma excitation may activate film-forming chemical reactions that are not energetically or kinetically favored in thermal CVD. The chemical and physical properties of PECVD films may thus be varied over a relatively wide range by adjusting process parameters.

SiN has been widely used in semiconductor devices as a passivation film, a diffusion barrier, and an etch-stop film. Device quality SiN films have been deposited by PECVD using silane ($SiH_4$) and ammonia ($NH_3$) or thermal CVD using dichlorosilane ($SiH_2Cl_2$) and $NH_3$. However, the explosive behavior of $SiH_4$ and corrosive behavior of $SiH_2Cl_2$ requires strict control over processing conditions and careful handling of the process effluent. Furthermore, deposition of SiN films from $SiH_2Cl_2$ require high deposition temperatures that are incompatible with advanced device processing requiring a low thermal budget. New low-thermal CVD processes have been developed for depositing SiN films using bis-(tert-butylamino)silane (BTBAS) and hexachlorodisilane (HCD) but alternative deposition methods are required that can provide improved device performance, lower thermal budget, and reduced maintenance of the processing system.

SUMMARY OF THE INVENTION

A system and method are provided for low-temperature plasma-enhanced deposition of silicon-nitrogen-containing films on a substrate. To this end, the method includes providing a substrate in a process chamber, exciting a reactant gas in a remote plasma source, thereafter mixing the excited reactant gas with a silazane precursor gas, and depositing a silicon-nitrogen-containing film on the substrate from the excited gas mixture in a chemical vapor deposition process.

In one embodiment of the invention, a method is provided for low-temperature plasma-enhanced deposition of a SiCNH film on a substrate. The method includes providing a substrate in a process chamber, exciting a nitrogen-containing reactant gas in a remote plasma source, thereafter mixing the excited reactant gas with a silazane precursor gas, and depositing a SiCNH film on the substrate from the excited gas mixture in a chemical vapor deposition process. The nitrogen-containing reactant gas can contain $N_2$, $NH_3$, $N_2H_2$, NO, or $N_2O$, or a combination of two or more thereof.

In another embodiment of the invention, a method is provided for low-temperature plasma-enhanced deposition of a SiCNOH film on a substrate. The method includes providing a substrate in a process chamber, exciting an oxygen-containing reactant gas in a remote plasma source, thereafter mixing the excited reactant gas with a silazane precursor gas, and depositing a SiCNOH film on the substrate from the excited gas mixture in a chemical vapor deposition process. The oxygen-containing reactant gas can contain $O_2$, $O_3$, $H_2O_2$, $H_2O$, NO, or $N_2O$, or a combination of two or more thereof.

DETAILED DESCRIPTION OF SEVERAL EMBODIMENTS OF THE INVENTION

Figure 1:
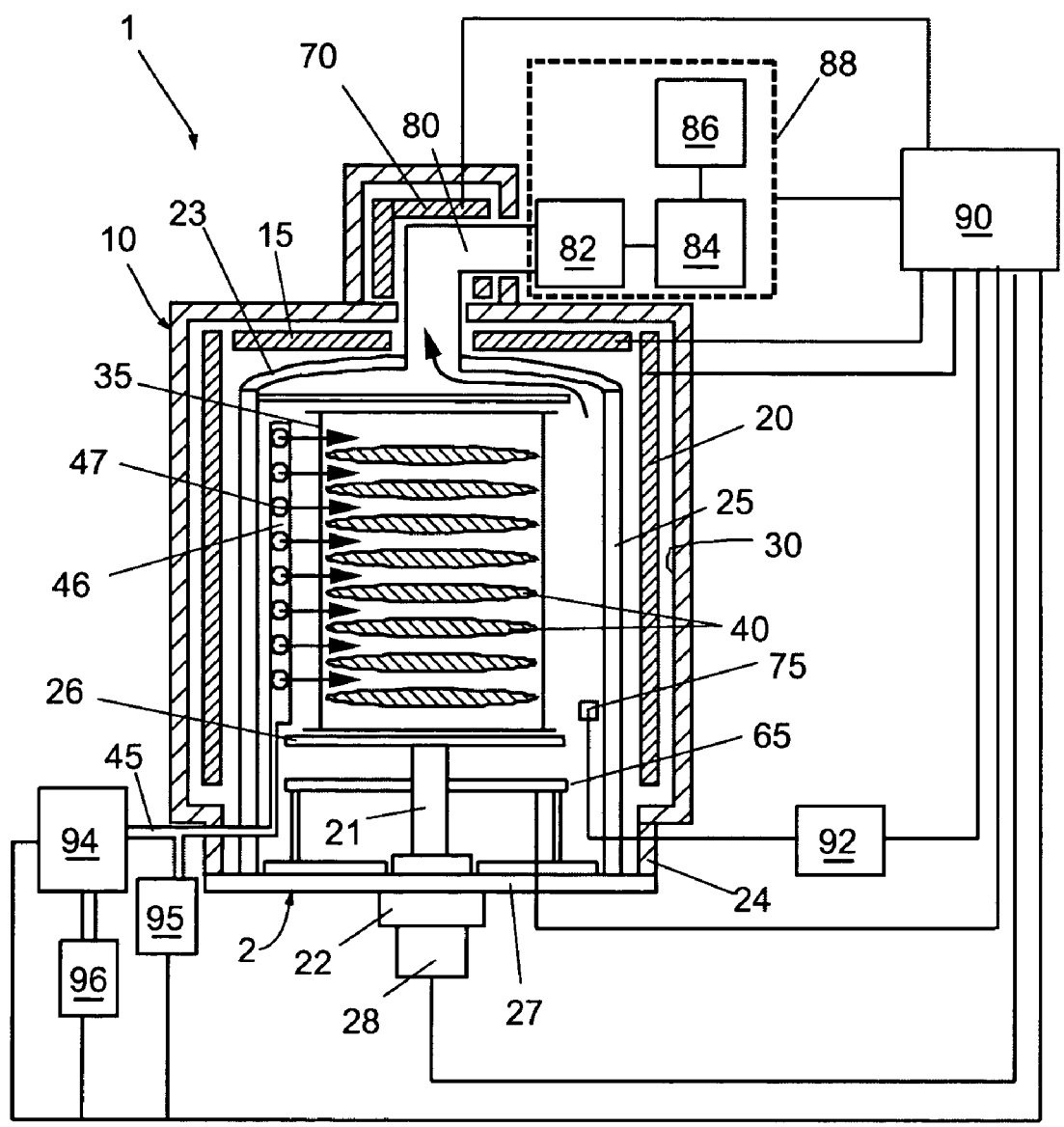
FIG. 1 shows a simplified block diagram of a batch-type processing system for low-temperature plasma-enhanced deposition of a silicon-nitrogen-containing film on a substrate according to an embodiment of the invention.

FIG. 1 shows a simplified block diagram of a batch-type processing system for low-temperature plasma-enhanced deposition of a silicon-nitrogen-containing film on a substrate according to an embodiment of the invention. The batch-type processing system 1 contains a process chamber 10 and a process tube 25 therein that has an upper end 23 connected to a exhaust pipe 80, and a lower end 24 hermetically joined to a lid 27 of cylindrical manifold 2. The exhaust pipe 80 discharges gases from the process tube 25 to a vacuum pumping system 88 to maintain a pre-determined reduced pressure in the processing system 1. A substrate holder 35 for holding a plurality of substrates (wafers) 40 in a tier-like manner (in respective horizontal planes at vertical intervals) is placed in the process tube 25. The substrate holder 35 resides on a turntable 26 that is mounted on a rotating shaft 21 penetrating the lid 27 and driven by a motor 28. The turntable 26 can be rotated during processing to improve overall film uniformity or, alternately, the turntable can be stationary during processing. The lid 27 is mounted on an elevator 22 for transferring the substrate holder 35 in and out of the reaction tube 25. When the lid 27 is positioned at its uppermost position, the lid 27 is adapted to close the open end of the manifold 2.

A cylindrical heat reflector 30 is disposed so as to cover the reaction tube 25. The heat reflector 30 has a mirror-finished inner surface to suppress dissipation of radiation heat radiated by main heater 20, bottom heater 65, top heater 15, and exhaust pipe heater 70. A helical cooling water passage (not shown) is formed in the wall of the process chamber 10 as a cooling medium passage.

The batch-type processing system 1 contains a gas delivery system that includes a gas supply line 45. The gas supply line 45 is connected to silazane gas source 95 and remote plasma source 94. A remote plasma source refers to a plasma source that is positioned remote from the process chamber, i.e., outside of the chamber in which the substrate will be processed, such that the excited gas must thereafter be delivered to the process chamber. The silazane gas source 95 can include a liquid delivery system and a silazane source. The flow of liquid silazane precursor material into a vaporizer can be controlled using a liquid mass flow controller where vaporized silazane precursor material can be further mixed with an inert carrier gas such as argon (Ar). Alternatively, if the vapor pressure of the silazane material is high enough, a bubbling system that utilizes and an inert carrier gas can be used instead. The remote plasma source 94 is configured for exciting a reactant gas from the reactant gas source 96. The remote plasma source 94 can, for example, be a microwave plasma source where the microwave power can be between about 500 Watts (W) and about 5,000 W. The microwave frequency can, for example, be 2.45 GHz or 8.3 GHz.

The excited reactant gas is mixed with a silazane precursor gas from the gas source 95 in the gas supply line 45 downstream from the remote plasma source 94. The resulting excited gas mixture is then flowed into the reaction tube 25 of the process chamber 10. Though not specifically shown, the present invention also contemplates that the excited reactant gas from remote plasma source 94 may be mixed with the silazane precursor gas from gas source 95 downstream of the remote plasma source 94 but inside the process chamber 10 prior to introducing the excited gas mixture to the reaction tube 25. In the embodiment illustrated in FIG. 1, the gas delivery system further contains a gas injection system 46 extending in the stacking direction of the plurality of substrates 40. The excited gas mixture exits the gas injection system 46 through a plurality of holes 47 and flows over the substrates 40, thereby depositing a silicon-nitrogen-containing film on the substrates 40.

The vacuum pumping system 88 comprises a vacuum pump 86, a trap 84, and automatic pressure controller (APC) 82. The vacuum pump 86 can, for example, include a dry vacuum pump capable of a pumping speed up to 20,000 liters per second (and greater). During processing, the process pressure can be adjusted by the APC 82. The trap 84 can collect unreacted precursor material and reaction by-products from the process chamber 10.

The process monitoring system 92 comprises a sensor 75 capable of real-time process monitoring and can, for example, comprise a mass spectrometer (MS) or a Fourier transform infrared (FTIR) spectrometer. A controller 90 includes a microprocessor, a memory, and a digital I/O port capable of generating control voltages sufficient to communicate and activate inputs to the processing system 1 as well as monitor outputs from the processing system 1. Moreover, the controller 90 is coupled to and can exchange information with gas sources 95 and 96, remote plasma source 94, motor 28, process monitoring system 92, heaters 20, 15, 65, and 70, and vacuum pumping system 88. The controller 90 may be implemented as a DELL PRECISION WORKSTATION 610™, available from Dell Corporation, Austin, Tex.

Figure 2:
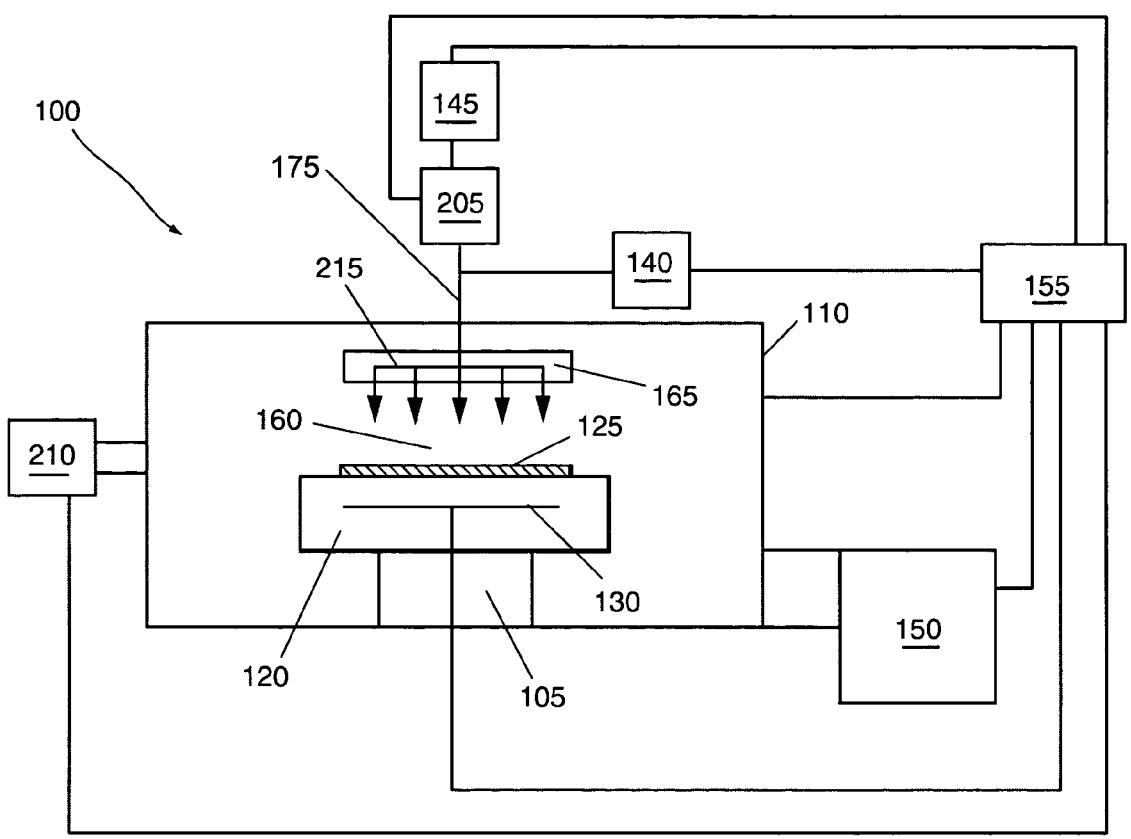
FIG. 2 shows a simplified block diagram of a single-wafer processing system for low-temperature plasma-enhanced deposition of a silicon-nitrogen-containing film on a substrate according to another embodiment of the invention.

FIG. 2 shows a simplified block diagram of a single-wafer processing system for low-temperature plasma-enhanced deposition of a silicon-nitrogen-containing film on a substrate according to another embodiment of the invention. The processing system 100 includes a process chamber 110 having a pedestal 105 for mounting a substrate holder 120 that supports a substrate 125 and exposes the substrate 125 to the processing region 160. The substrate holder 120 can be further configured for heating or cooling the substrate 125.

A reactant gas from reactant gas supply 145 is flowed into the remote plasma source 205 configured for plasma exciting the reactant gas. The remote plasma source 205 can, for example, be a microwave plasma source where the microwave power can be between about 500 Watts (W) and about 5,000 W. The microwave frequency can, for example, be 2.45 GHz or 8.3 GHz. Downstream from the remote plasma source 205, a gas source 140 supplies a silazane precursor gas that is mixed with the excited reactant gas in a gas delivery system containing a gas supply line 175. Analogously, as described above for FIG. 1, the gas source 140 can include a liquid delivery system or a bubbling system. The resulting excited gas mixture 215 is then flowed into the process chamber 110. The excited gas mixture 215 can be introduced to the processing region 160 in the process chamber 110 using the gas delivery system that further contains a gas injection plenum (not shown), a series of baffle plates (not shown) and a multi-orifice showerhead gas injection plate 165. Though not specifically shown, the present invention also contemplates that the excited reactant gas from the remote plasma source 205 may be mixed with the silazane precursor gas from gas source 140 downstream of the remote plasma source 205 but inside the process chamber 110 prior to introducing the excited gas mixture 215 to the processing region 160. The process chamber 110 is connected to vacuum pump system 150 that can include a turbo-molecular vacuum pump (TMP) capable of a pumping speed up to about 5,000 liters per second (and greater), and a gate valve for controlling the gas pressure.

Substrate 125 is transferred in and out of process chamber 110 through a slot valve (not shown) and chamber feedthrough (not shown) via a robotic substrate transfer system 210 where it is received by substrate lift pins (not shown) housed within substrate holder 120 and mechanically translated by devices housed therein. Once the substrate 125 is received from the substrate transfer system 210, it is lowered to an upper surface of the substrate holder 120.

The substrate 125 can be affixed to the substrate holder 120 via an electrostatic clamp (not shown). Furthermore, the substrate holder 120 includes a heater element 130 and the substrate holder 120 can further include a cooling system including a re-circulating coolant flow that receives heat from the substrate holder 120 and transfers heat to a heat exchanger system (not shown). Moreover, gas may be delivered to the backside of the substrate to improve the gas-gap thermal conductance between the substrate 125 and the substrate holder 120. Such a system can be utilized when temperature control of the substrate is required at elevated or reduced temperatures.

A controller 155 includes a microprocessor, a memory, and a digital I/O port capable of generating control voltages sufficient to communicate and activate inputs to the processing system 100 as well as monitor outputs from the processing system 100. Moreover, the controller 155 is coupled to and exchanges information with the process chamber 110, the gas sources 140 and 145, the remote plasma source 205, the heating element 130, the substrate transfer system 210, and the vacuum pump system 150. For example, a program stored in the memory can be utilized to control the aforementioned components of a processing system 100 according to a stored process recipe. One example of controller 155 is a DELL PRECISION WORKSTATION 610™, available from Dell Corporation, Austin, Tex.

It is to be understood that the processing systems depicted in FIGS. 1 and 2 are shown for exemplary purposes only, as many variations of the specific hardware can be used to implement processing systems in which the present invention may be practiced, and these variations will be readily apparent to one having ordinary skill in the art. The processing systems in FIGS. 1 and 2 can, for example, process substrates of any size, such as 200 mm substrates, 300 mm substrates, or even larger substrates.

Figure 3:
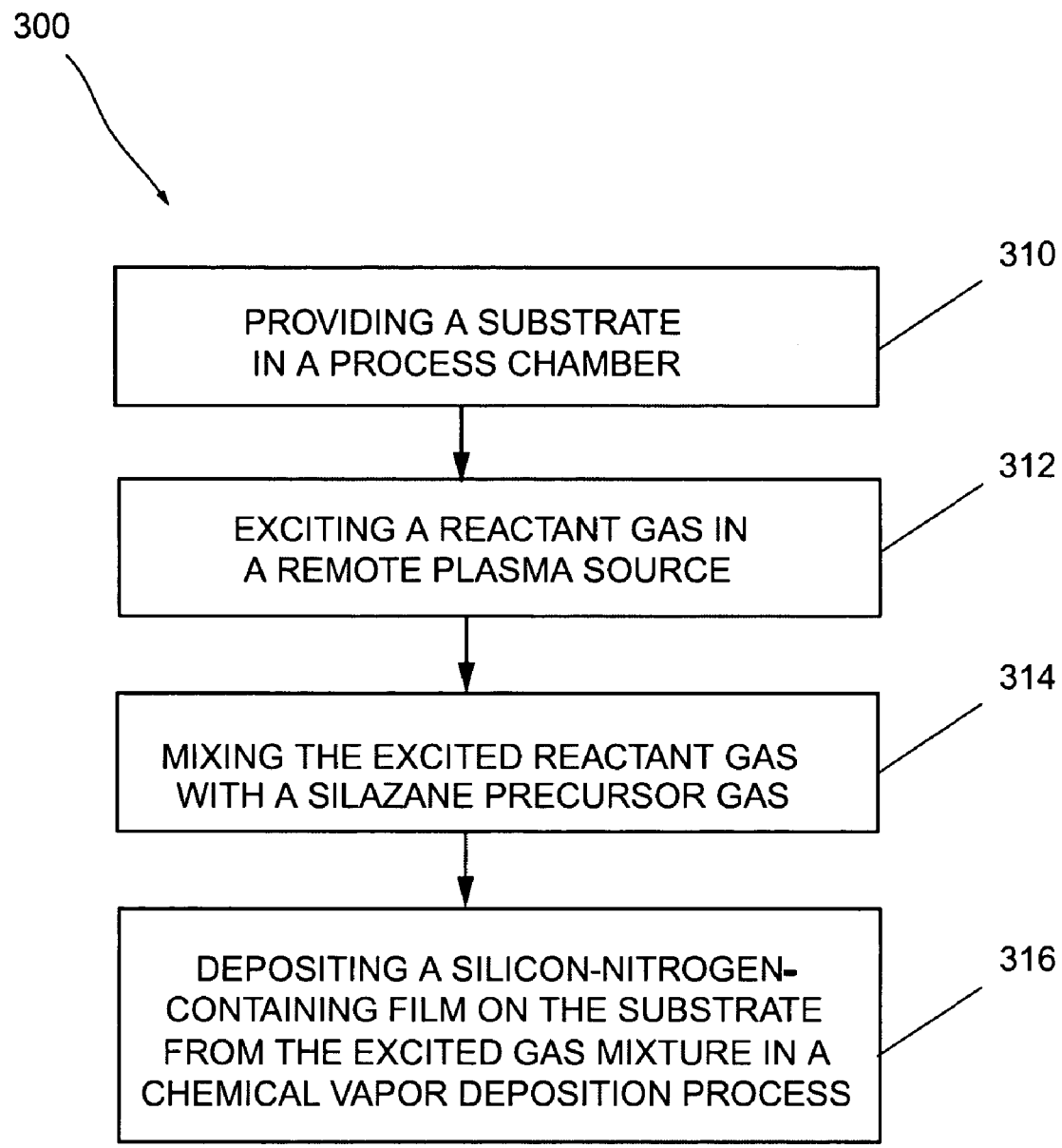
FIG. 3 is a flow diagram for low-temperature plasma-enhanced deposition of a silicon-nitrogen-containing film on a substrate according to an embodiment of the invention.

FIG. 3 is a flow diagram for low-temperature plasma-enhanced deposition of a silicon-nitrogen-containing film on a substrate according to an embodiment of the invention. The process 300 includes providing a substrate in a process chamber at 310. The process chamber can, for example, be one of the process chambers 1 or 100 shown in FIGS. 1 and 2, respectively. The substrate can, for example, be a semiconductor substrate, such as a Si substrate, a Ge-containing Si substrate, a Ge substrate, or a compound semiconductor substrate, and can include numerous active devices and/or isolation regions.

At 312, a reactant gas is flowed into and excited in a remote plasma source. In one embodiment of the invention, the reactant gas can contain a nitrogen-containing gas. In another embodiment of the invention, the reactant gas can contain an oxygen-containing gas. At 314, the plasma-excited reactant gas is mixed with a silazane precursor gas downstream from the remote plasma source. At 316, a silicon-nitrogen-containing film is deposited on a substrate in the process chamber from the excited gas mixture in a chemical vapor deposition process.

According to embodiments of the invention, the formation of the excited reactant gas in the remote plasma source is separated from the actual mixing of the excited reactant gas with the silicon-containing silazane precursor gas. This separation can provide greater control over the deposition process, the composition of the silicon-nitrogen-containing film, and the film properties. The excited reactant gas contains radicals (e.g., $N^*$, $NH_x^*$) which, when mixed with the silazane precursor gas, allow for lowering of the substrate deposition temperature and reducing and controlling the carbon content and the hydrogen content of the deposited silicon-nitrogen-containing film.

Unlike plasma polymerization processing where all the gases are exposed to a plasma source, and the substrate is usually in direct contact with the plasma source; embodiments of the current invention utilize a remote plasma source where the silicon-containing silazane precursor gas is not in direct contact with the plasma source but is mixed with the plasma-excited reactant gas downstream from the remote plasma source. Therefore, the substrate is not subjected to ion bombardment that can result in damage to the deposited film.

According to the embodiments of the invention, suitable process conditions that enable formation of silicon-nitrogen-containing films with desired film thicknesses and film properties can be determined by direct experimentation and/or design of experiments (DOE). Adjustable process parameters can, for example, comprise remote plasma power, substrate temperature, process pressure, type of reactant gas and silazane gas, and relative gas flows.

In one embodiment of the invention, the reactant gas can contain a nitrogen-containing gas and the deposited silicon-nitrogen-containing film can further contain carbon and hydrogen (i.e., SiCNH). The nitrogen-containing gas can include $N_2$, $NH_3$, $N_2H_2$, NO, or $N_2O$, or a combination of two or more thereof. The nitrogen-containing gas can, for example, have a gas flow rate to the plasma source between about 10 sccm and about 5,000 sccm. SiCNH films can be used in applications that currently use silicon nitride films deposited by thermal CVD or PECVD processing. Low carbon content SiCNH films can provide improved film properties compared to silicon nitride films, including improved diffusion barrier properties and improved control over the etch selectivity of the film compared to other films in a semiconductor microstructure. The carbon content and hydrogen content of the silicon-nitrogen-containing films can be adjusted by varying the process conditions, including the plasma power, the substrate temperature, the process pressure, the type of reactant gas and silazane gas, and relative gas flows.

In one embodiment of the invention, the individual amounts of carbon and hydrogen in the deposited SiCNH film can be less than the individual amounts of silicon and nitrogen in the film. In another embodiment of the invention, the combined amount of carbon and hydrogen in the deposited SiCNH film can be less than the combined amount of silicon and nitrogen in the film.

In another embodiment of the invention, the reactant gas can contain an oxygen-containing gas and the deposited silicon-nitrogen-containing film can further contain carbon, oxygen, and hydrogen (i.e., SiCNOH). The oxygen containing gas can include $O_2$, $O_3$, $H_2O_2$, $H_2O$, NO, or $N_2O$, or a combination of two or more thereof. The oxygen-containing gas can, for example, have a gas flow rate to the plasma source between about 10 sccm and about 5,000 sccm. SiCNOH films find applications as low-k interlayer films that require a low thermal budget and are compatible with other films on the substrate.

In one embodiment of the invention, the individual amounts of carbon and hydrogen in the deposited SiCNOH film can be less than the individual amounts of silicon and oxygen in the film. In another embodiment of the invention, the combined amount of carbon and hydrogen in the deposited SiCNOH film can be less than the combined amount of silicon and oxygen in the film.

In one embodiment of the invention, the excited gas mixture can further contain an inert gas, for example He, Ne, Ar, Kr, or Xe, or a combination of two or more thereof. The inert gas flow rate to the plasma source can, for example, be between about 5 sccm and about 20,000 sccm. Processing conditions used for depositing a silicon-nitrogen-containing film can include a process chamber pressure between about 10 mTorr and about 400 Torr. The process conditions can further include a substrate temperature between about 150° C. and about 600° C.

A silazane precursor contains a Si-N structural unit. An organic silazane precursor can further contain at least one alkyl group bonded to the Si atom(s). The alkyl group can, for example, be a methyl group, an ethyl group, a propyl group, or a butyl group, or combinations thereof. Furthermore, the alkyl group can be a cyclic hydrocarbon group such as a phenyl group. In addition, the alkyl group can be a vinyl group. According to an embodiment of the invention, the silazane gas flow rate can be between about 1 sccm and about 500 sccm. Examples of silazane and organic silazane compounds that can be utilized to deposit silicon-nitrogen-containing films according to embodiments of the invention are shown in TABLE 1.

TABLE 1

| | |
|---|---|
| Triethylsilazane | $SiC_6H_{17}N$ |
| Tripropylsilazane | $SiC_9H_{23}N$ |
| Triphenylsilazane | $SiC_{18}H_{17}N$ |
| Tetramethyldisilazane | $Si_2C_4H_{15}N$ |
| Hexamethyldisilazane | $Si_2C_6H_{19}N$ |
| Hexaethyldisilazane | $Si_2C_{12}H_{31}N$ |
| Hexaphenyldisilazane | $Si_2C_{36}H_{31}N$ |
| Heptamethyldisilazane | $Si_2C_7H_{21}N$ |
| Dipropyl-tetramethyldisilazane | $Si_2C_{10}H_{27}N$ |
| Di-n-Butyl-tetramethyldisilazane | $Si_2C_{12}H_{31}N$ |
| Di-n-Octyl-tetramethyldisilazane | $Si_2C_{20}H_{47}N$ |
| Triethyl-trimethylcyclotrisilazane | $Si_3C_9H_{27}N_3$ |
| Hexamethylcyclotrisilazane | $Si_3C_6H_{21}N_3$ |
| Hexaethylcyclotrisilazane | $Si_3C_{12}H_{33}N_3$ |
| Hexaphenylcyclotrisilazane | $Si_3C_{36}H_{33}N_3$ |
| Octamethylcyclotetrasilazane | $Si_4C_8H_{28}N_4$ |
| Octaethylcyclotetrasilazane | $Si_4C_{16}H_{44}N_4$ |
| Tetraethyl-tetramethylcyclotetrasilazane | $Si_4C_{12}H_{36}N_4$ |
| Cyanopropylmethylsilazane | $SiC_5H_{10}N_2$ |
| Tetraphenyldimethyldisilazane | $Si_2C_{26}H_{27}N$ |
| Diphenyl-tetramethyldisilazane | $Si_2C_{16}H_{23}N$ |
| Trivinyl-trimethylcyclotrisilazane | $Si_3C_9H_{21}N_3$ |
| Tetravinyl-tetramethylcyclotetrasilazane | $Si_4C_{12}H_{28}N_4$ |
| Divinyl-tetramethyldisilazane | $Si_2C_8H_{19}N$ |

The structure below shows a hexamethyldisilazane precursor for low-temperature plasma-enhanced deposition of a silicon-nitrogen-containing film on a substrate according to an embodiment of the invention:

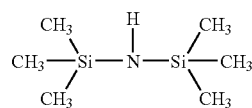

The hexamethyldisilazane (HMDS) precursor contains a Si—N—Si structural unit and three methyl groups bonded to each Si atom. The HMDS precursor is a commercially available silicon compound with a vapor pressure of about 20 Torr at 20° C. HMDS has been utilized in semiconductor manufacturing as a treatment gas to improve photoresist adhesion and to reduce moisture intake to the underlying oxide by increasing the surface hydrophobicity. HMDS has an advantage in the present invention as a precursor gas over various silicon-containing CVD precursors in that the HMDS precursor and process effluent are safer and easier to handle, the HMDS precursor is low cost, and it results in less corrosive discharge gases.

Although only certain embodiments of this invention have been described in detail above, those skilled in the art will readily appreciate that many modifications are possible in the exemplary embodiment without materially departing from the novel teachings and advantages of this invention. Accordingly, all such modifications are intended to be included within the scope of this invention.

What is claimed is:

1. A method for depositing a silicon-nitrogen-containing film, the method comprising:
   providing a substrate in a process chamber;
   exciting a reactant gas in a plasma source remote from the process chamber;
   thereafter, mixing the excited reactant gas with a silazane precursor gas to form a gas mixture of the excited reactant gas and the silazane precursor gas; and
   depositing a silicon-nitrogen-containing film on the substrate in the process chamber from the gas mixture in a chemical vapor deposition process.

2. The method according to claim 1, wherein the substrate comprises a Si substrate, a Ge-containing Si substrate, a Ge substrate, or a compound semiconductor substrate.

3. The method according to claim 1, wherein the reactant gas comprises a nitrogen-containing gas containing $N_2$, $NH_3$, $NH_2$, NO, or $N_2O$, or a combination of two or more thereof.

4. The method according to claim 3, wherein individual amounts of carbon and hydrogen in the deposited film are less than individual amounts of silicon and nitrogen in the film.

5. The method according to claim 3, wherein a combined amount of carbon and hydrogen in the deposited film is less than a combined amount of silicon and nitrogen in the film.

6. The method according to claim 3, further comprising delivering the nitrogen-containing gas to the plasma source at a flow rate between about 10 sccm and about 5,000 sccm.

7. The method according to claim 1, wherein the reactant gas comprises an oxygen-containing gas containing $O_2$, $O_3$, $H_2O_2$, $H_2O$, NO, or $N_2O$, or a combination of two or more thereof.

8. The method according to claim 7, wherein individual amounts of carbon and hydrogen in the deposited film are less than individual amounts of silicon and oxygen in the film.

9. The method according to claim 7, wherein a combined amount of carbon and hydrogen in the deposited film is less than a combined amount of silicon and oxygen in the film.

10. The method according to claim 7, further comprising delivering the oxygen-containing gas to the plasma source at a flow rate between about 10 sccm and about 5,000 sccm.

11. The method according to claim 1, wherein the silazane precursor gas comprises an organic silazane precursor.

12. The method according to claim 1, wherein the silazane precursor gas comprises triethylsilazane, tripropylsilazane, triphenylsilazane, disilazane, tetramethyldisilazane, hexamethyldisilazane, hexaethyldisilazane, hexaphenyldisilazane, heptamethyldisilazane, dipropyl-tetramethyldisilazane, di-n-Butyl-tetramethyldisilazane, di-n-Octyl-tetramethyldisilazane, triethyl-trimethylcyclotrisilazane, hexamethylcyclotrisilazane, hexaethylcyclotrisilazane, hexaphenylcyclotrisilazane, octamethylcyclotetrasilazane, octaethylcyclotetrasilazane, tetraethyl-tetramethylcyclotetrasilazane, cyanopropylmethylsilazane, tetraphenyldimethyldisilazane, diphenyl-tetramethyldisilazane, trivinyl-trimethylcyclotrisilazane, tetravinyl-tetramethylcyclotetrasilazane, or divinyl-tetramethyldisilazane, or a combination of two or more thereof.

13. The method according to claim 1, wherein the silazane gas is mixed with the excited reactant gas at a flow rate between about 1 sccm and about 500 sccm.

14. The method according to claim 1, further comprising operating the process chamber at a gas pressure between about 10 mTorr and about 400 Torr.

15. The method according to claim 1, further comprising heating the substrate to between about 150° C. and about 600° C.

16. The method according to claim 1, wherein the gas mixture further comprises an inert gas.

17. The method according to claim 16, wherein the inert gas is delivered at a flow rate between about 5 sccm and about 20,000 sccm.

18. The method according to claim 1, wherein the providing comprises placing between 1 and 200 substrates in a batch-type process chamber.

19. The method according to claim 1, wherein the providing comprises placing a single substrate in a single wafer process chamber.

20. The method according to claim 1, wherein the mixing comprises mixing the excited reactant gas with the silazane precursor gas inside the process chamber downstream from the plasma source.

21. The method according to claim 1, wherein the silicon-nitrogen-containing film is a sidewall film, a baffler film, an etch stop film, or a low-k film.

22. The method according to claim 1, wherein the exciting comprises plasma-exciting the reactant gas in a remote microwave plasma source.

23. A method for depositing a SiCNH film, the method comprising:
   providing a substrate in a process chamber;
   exciting a nitrogen-containing reactant gas in a plasma source remote from the process chamber;
   thereafter, mixing the excited reactant gas with a silazane precursor gas to form a gas mixture of the excited reactant gas and the silazane precursor gas; and
   depositing a SiCNH film on the substrate from the gas mixture in a chemical vapor deposition process.

24. The method according to claim 23, wherein the individual amounts of carbon and hydrogen in the SiCNH film are less than the individual amounts of silicon and nitrogen in the film.

25. The method according to claim 23, wherein the substrate comprises a Si substrate, a Ge-containing Si substrate, a Ge substrate, or a compound semiconductor substrate.

26. The method according to claim 23, wherein the nitrogen-containing reactant gas contains $N_2$, $NH_3$, $N_2H_2$, NO, or $N_2O$, or a combination of two or more thereof.

27. The method according to claim 23, wherein the combined amount of carbon and hydrogen in the deposited film is less than the combined amount of silicon and nitrogen in the film.

28. The method according to claim 23, further comprising delivering the nitrogen-containing reactant gas to the plasma source at a flow rate between about 10 sccm and about 5,000 sccm.

29. The method according to claim 23, wherein the silazane precursor gas comprises an organic silazane precursor.

30. The method according to claim 23, wherein the silazane precursor includes triethylsilazane, tripropylsilazane, triphenylsilazane, disilazane, tetramethyldisilazane, hexamethyldisilazane, hexaethyldisilazane, hexaphenyldisilazane, heptamethyldisilazane, dipropyl-tetramethyldisilazane, di-n-Butyl-tetramethyldisilazane, di-n-Octyl-tetramethyldisilazane, triethyl-trimethylcyclotrisilazane, hexamethylcyclotrisilazane, hexaethylcyclotrisilazane, hexaphenylcyclotrisilazane, octamethylcyclotetrasilazane, octaethylcyclotetrasilazane, tetraethyl-tetramethylcyclotetrasilazane, cyanopropylmethylsilazane, tetraphenyldimethyldisilazane, diphenyl-tetramethyldisilazane, trivinyl-trimethylcyclotrisilazane, tetravinyl-tetramethylcyclotetrasilazane, or divinyl-tetramethyldisilazane, or a combination of two or more thereof.

31. The method according to claim 23, wherein the silazane gas is mixed with the excited reactant gas at a flow rate between about 1 sccm and about 500 sccm.

32. The method according to claim 23, further comprising operating the process chamber at a gas pressure between about 10 mTorr and about 400 Torr.

33. The method according to claim 23, further comprising heating the substrate to between about 150° C. and about 600° C.

34. The method according to claim 23, wherein the gas mixture further comprises an inert gas.

35. The method according to claim 34, wherein the inert gas is delivered at a flow rate between about 5 sccm and about 20,000 sccm.

36. The method according to claim 23, wherein the providing comprises placing between 1 and 200 substrates in a batch-type process chamber.

37. The method according to claim 23, wherein the providing comprises placing a single substrate in a single wafer process chamber.

38. The method according to claim 23, wherein the mixing comprises mixing the excited reactant gas with the silazane gas inside the process chamber downstream from the plasma source.

39. The method according to claim 23, wherein the SiCNH film is a sidewall film, a baffler film, an etch stop film, or a low-k film.

40. A method for depositing a SiCNOH film, the method comprising:
   providing a substrate in a process chamber;
   exciting an oxygen-containing reactant gas in a plasma source remote from the process chamber;
   thereafter, mixing the excited reactant gas with a silazane precursor gas to form a gas mixture of the excited reactant gas and the silazane precursor gas; and
   depositing a SiCNOH film on the substrate from the gas mixture in a chemical vapor deposition process.

41. The method according to claim 40, wherein the substrate comprises a Si substrate, a Ge-containing Si substrate, a Ge substrate, or a compound semiconductor substrate.

42. The method according to claim 40, wherein the reactant gas comprises an oxygen-containing gas containing $O_2$, $O_3$, $H_2O_2$, $H_2O$, NO, or $N_2O$, or a combination of two or more thereof.

43. The method according to claim 40, wherein the individual amounts of carbon and hydrogen in the deposited film are less than the individual amounts of silicon and oxygen in the film.

44. The method according to claim 40, wherein the combined amount of carbon and hydrogen in the deposited film is less than the combined amount of silicon and oxygen in the film.

45. The method according to claim 40, further comprising delivering the oxygen-containing reactant gas to the plasma source at a flow rate between about 10 sccm and about 5,000 sccm.

46. The method according to claim 40, wherein the silazane precursor gas comprises an organic silazane precursor.

47. The method according to claim 40, wherein the silazane precursor includes triethylsilazane, tripropylsilazane, triphenylsilazane, disilazane, tetramethyldisilazane, hexamethyldisilazane, hexaethyldisilazane, hexaphenyldisilazane, heptamethyldisilazane, dipropyl-tetramethyldisilazane, di-n-Butyl-tetramethyldisilazane, di-n-Octyl-tetramethyldisilazane, triethyl-trimethylcyclotrisilazane, hexamethylcyclotrisilazane, hexaethylcyclotrisilazane, hexaphenylcyclotrisilazane, octamethylcyclotetrasilazane, octaethylcyclotetrasilazane, tetraethyl-tetramethylcyclotetrasilazane, cyanopropylmethylsilazane, tetraphenyldimethyldisilazane, diphenyl-tetramethyldisilazane, trivinyl-trimethylcyclotrisilazane, tetravinyl-tetramethylcyclotetrasilazane, or divinyl-tetramethyldisilazane, or a combination of two or more thereof.

48. The method according to claim 40, wherein the silazane gas is mixed with the excited reactant gas at a flow rate between about 1 sccm and about 500 sccm.

49. The method according to claim 40, further comprising operating the process chamber at a gas pressure between about 10 mTorr and about 400 Torr.

50. The method according to claim 40, further comprising heating the substrate to between about 150° C. and about 600° C.

51. The method according to claim 40, wherein the gas mixture further comprises an inert gas.

52. The method according to claim 51, wherein the inert gas is delivered at a flow rate between about 5 sccm and about 20,000 sccm.

53. The method according to claim 40, wherein the providing comprises placing between 1 and 200 substrates in a batch-type process chamber.

54. The method according to claim 40, wherein the providing comprises placing a single substrate in a single wafer process chamber.

55. The method according to claim 40, wherein the mixing comprises mixing the excited reactant gas with the silazane gas inside the process chamber downstream from the plasma source.

56. The method according to claim 40, wherein the SiCNOH film is a sidewall film, a baffler film, an etch stop film, or a low-k film.

* * * * *

UNITED STATES PATENT AND TRADEMARK OFFICE
CERTIFICATE OF CORRECTION

PATENT NO. : 7,129,187 B2
APPLICATION NO. : 10/891301
DATED : October 31, 2006
INVENTOR(S) : Raymond Joe It is certified that error appears in the above-identified patent and that said Letters Patent is hereby corrected as shown below:

Title Page (56) Other Publications Page 1, "α-Si:" should read --a-Si:--.
Title Page (56) Other Publications Page 1, "*by PECVD* Thin Solid Films" should read --*by PECVD*, Thin Solid Films--.
Title Page (56), Col. 1, line 1, "SiO, Films" should read --$SiO_2$ Films--.
Title Page (56) Page 2, Col. 1, line 13, "fo Crystal Growth" should read --of Crystal Growth--.
Title Page (56) Page 2, Col. 2, line 11, "PAy Additional" should read --Pay Additional--.
Lines from column 8, line 18 through column 10 line 52 should be deleted.
In column 10, line 53, change "40" to --1--.
In column 10, line 64, change "41" to --2--, and "40" to --1--.
In column 11, line 1, change "42" to --3--, and "40" to --1--.
In column 11, line 5, change "43" to --4--, and "40" to --1--.
In column 11, line 9, change "44" to --5--, and "40" to --1--.
In column 11, line 13, change "45" to --6--, and "40" to --1--.
In column 11, line 17, change "46" to --7--, and "40" to --1--.
In column 11, line 20, change "47" to --8--, and "40" to --1--.
In column 12, line 4, change "48" to --9--, and "40" to --1--.
In column 12, line 7, change "49" to --10--, and "40" to --1--.
In column 12, line 10, change "50" to --11--, and "40" to --1--.
In column 12, line 13, change "51" to --12--and "40" to --1--.
In column 12, line 15, change "52" to --13--, and "51" to --12--.
In column 12, line 18, change "53" to --14--, and "40" to --1--.
In column 12, line 21, change "54" to --15--, and "40" to --1--.
In column 12, line 24, change "55" to--16--, and "40" to --1--.
In column 12, line 28, change "56" to --17--, and "40" to --1--.

UNITED STATES PATENT AND TRADEMARK OFFICE
CERTIFICATE OF CORRECTION

PATENT NO. : 7,129,187 B2
APPLICATION NO. : 10/891301
DATED : October 31, 2006
INVENTOR(S) : Raymond Joe It is certified that error appears in the above-identified patent and that said Letters Patent is hereby corrected as shown below:

In column 12, line 29, change "baffler" to --barrier--.

Signed and Sealed this

Eleventh Day of September, 2007

JON W. DUDAS
*Director of the United States Patent and Trademark Office*